(12) United States Patent
Baba et al.

(10) Patent No.: US 8,445,942 B2
(45) Date of Patent: May 21, 2013

(54) SEMICONDUCTOR DEVICE HAVING METAL OXIDE FILM

(75) Inventors: Ryohei Baba, Niiza (JP); Shinichi Iwakami, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 221 days.

(21) Appl. No.: 12/544,292

(22) Filed: Aug. 20, 2009

(65) Prior Publication Data

US 2010/0078683 A1      Apr. 1, 2010

(30) Foreign Application Priority Data

Sep. 30, 2008   (JP) ................................. 2008-255232

(51) Int. Cl.
*H01L 29/778*   (2006.01)
(52) U.S. Cl.
USPC ................... 257/194; 257/192; 257/E29.246
(58) Field of Classification Search
USPC ................... 257/192, 194, E29.246
See application file for complete search history.

(56) References Cited

U.S. PATENT DOCUMENTS

| 7,038,253 B2 | 5/2006 | Yoshida et al. | |
| 7,256,432 B2* | 8/2007 | Okamoto et al. | 257/192 |
| 7,304,331 B2* | 12/2007 | Saito et al. | 257/192 |
| 2006/0157729 A1* | 7/2006 | Ueno et al. | 257/103 |
| 2007/0069240 A1* | 3/2007 | Passlack | 257/192 |
| 2011/0012110 A1* | 1/2011 | Sazawa et al. | 257/51 |

FOREIGN PATENT DOCUMENTS

| JP | 2008034438 A | * | 2/2008 |
| WO | WO 03/071607 A1 | | 8/2003 |
| WO | WO 2007108404 A1 | * | 9/2007 |

OTHER PUBLICATIONS

U.S. Appl. No. 13/033,042, filed Feb. 23, 2011, Iwakami, et al.

* cited by examiner

*Primary Examiner* — Mamadou Diallo
*Assistant Examiner* — John P Dulka
(74) *Attorney, Agent, or Firm* — Oblon, Spivak, McClelland, Maier & Neustadt, L.L.P.

(57) ABSTRACT

A semiconductor device includes: a nitride group semiconductor functional layer including a second nitride group semiconductor region on a first nitride group semiconductor region where a two-dimensional carrier gas layer is made, the second nitride group semiconductor region functioning as a barrier layer; a first main electrode electrically connected to one end of the two-dimensional carrier gas layer; a second main electrode electrically connected to the other end of the two-dimensional carrier gas layer; and a metal oxide film placed between the first and second main electrodes, electrically connected to the first main electrode, the first main electrode extends over an upper surface of the metal oxide film.

12 Claims, 5 Drawing Sheets

SEMICONDUCTOR DEVICE HAVING METAL OXIDE FILM

CROSS REFERENCE TO RELATED APPLICATION

This application is based upon and claims the benefit of priority from the prior Japanese Patent Application No. 2008-255.232 filed on Sep. 30, 2008, the entire contents of which is incorporated herein by reference.

BACKGROUND OF THE INVENTION

1. Field of the Invention

The present invention relates to a semiconductor device, and more particularly to a semiconductor device which includes a nitride group functional semiconductor layer having a two-dimensional carrier gas layer near a hetero junction.

2. Description of the Related Art

Horizontal Shottky barrier diodes (SBD) are well-known, and have a hetero junction structure constituted by gallium nitride (GaN) and aluminum gallium nitride (AlGaN). Such a horizontal SBD is fabricated as a nitride group functional semiconductor layer having a GaN layer and an AlGaN layer placed on the GaN layer by the hetero junction. The SBD also includes not only a two-dimensional electron gas channel layer (2EDG) which is generated near the hetero junction of the GaN layer but also an anode electrode and a cathode electrode which are electrically connected to opposite ends of the 2EDG channel layer by the tunnel effect or the like.

The anode electrode is electrically connected to the one end of the 2EDG channel layer by forming a Shottky barrier, and is a composite film of a nickel (Ni) layer and a gold (Au) layer on the Ni layer, for instance.

Further, the cathode electrode is in ohmic contact with the other end of the 2EDG channel layer, and is a composite layer of a titanium (Ti) layer and an aluminum (Al) layer on the titanium layer.

An example of the horizontal SBDs is disclosed in WO 03/071607 A1.

The invention disclosed in the foregoing publication seems to have the following problems. With the horizontal SBD, the anode electrode is constituted by a composite film of the Ni and Au layers, and has a large reverse leakage current. The large reverse leakage current can be reduced by selectively using a transition metal such as platinum (Pt) or rhodium (Rh) as an electrode material for the anode electrode, but cannot be suppressed sufficiently. If such a material is used for the anode electrode, the horizontal SBD tends to have a high rising voltage Vf during a forward operation. Further, the horizontal SBD has a high differential on-resistance.

In terms of the crystal growth of the nitride group semiconductor functional layer, it is conceivable to reduce a carrier density of the secondary nitride group semiconductor functional layer produced near the hetero junction, and to suppress the reverse leakage current. However, as the carrier density is reduced, the differential on-state resistance tends to become higher in the forward operation of existing horizontal SBDs. In other words, the reduction of the reverse leakage current and the reduction of the differential on-resistance are contradictory to each other.

SUMMARY OF THE INVENTION

The present invention has been contemplated in order to overcome the foregoing problems, and intends to provide a semiconductor device which can not only maintain forward characteristics but also reduce the reverse leakage current in the forward operation.

According to a first feature of the embodiment of the invention, a semiconductor device includes: a nitride group semiconductor functional layer including a second nitride group semiconductor region on a first nitride group semiconductor region where a two-dimensional carrier gas layer is made, the second nitride group semiconductor region functioning as a barrier layer; a first main electrode electrically connected to one end of the two-dimensional carrier gas layer; a second main electrode electrically connected to the other end of the two-dimensional carrier gas layer; and metal oxide films placed between the first and second main electrodes, and electrically connected to the first main electrode.

In accordance with a second feature of the embodiment of the invention, a semiconductor device includes: a nitride group semiconductor functional layer including a second nitride group semiconductor region on a first nitride group semiconductor region where a two-dimensional carrier gas layer is made, the second nitride group semiconductor region functioning as a barrier layer; a first main electrode electrically connected to one end of the two-dimensional carrier gas layer; a second main electrode electrically connected to the other end of the two-dimensional carrier gas layer by ohmic contact; and metal oxide films placed between the first and second main electrodes, and on the two-dimensional carrier gas layer via a part of the nitride group semiconductor functional layer, the metal oxide films reducing a carrier density of the two-dimensional carrier gas layer and electrically connected to the first main electrode.

In addition to the first or second feature of the embodiment, the metal oxide films are preferably constituted by nickel oxide, iron oxide, cobalt oxide, manganese oxide or copper oxide.

Further, the metal oxide films preferably surround the first main electrode intermittently or continuously.

Further, the metal oxide films are preferably buried in recesses extending from a surface of the nitride group semiconductor functional layer to the two-dimensional carrier gas layer.

Still further, the first main electrode preferably extends to the metal oxide films via an insulating film.

The invention can provide a semiconductor device which can not only maintain forward characteristics in the forward operation but also reduce the reverse leakage current.

DETAILED DESCRIPTION OF THE INVENTION

Figure 1:
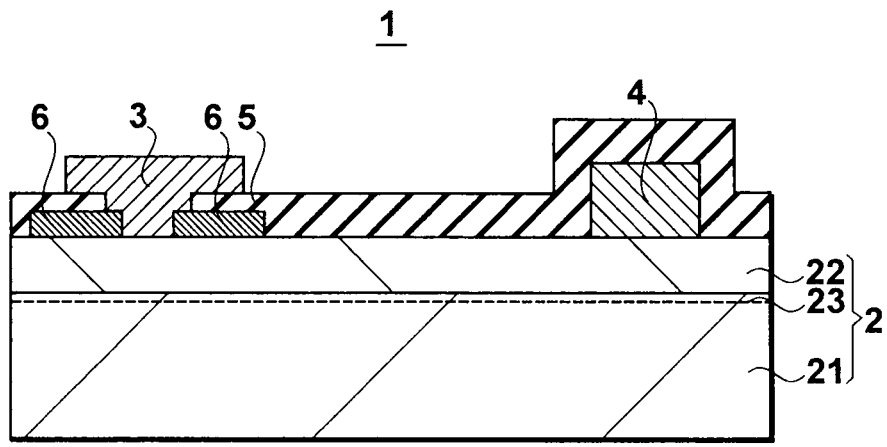
FIG. 1 is a cross sectional view of an essential part of a semiconductor device according to a first embodiment of the invention.

The invention will be described with reference to specific embodiments shown in the drawings. Like or corresponding parts are denoted by like or corresponding reference numerals. The drawings are schematic, and may be sometimes depicted using different scales. Further, components may be differently depicted from actual components.

The specific embodiments and applications thereof will be disclosed in order to exemplify devices and methods for carrying out the technical concept of the invention. Obviously, modifications and alterations will occur upon reading and understanding the detailed description. It is intended that the invention be construed as including all such modifications and alterations insofar as they come within the scope of the appended claims or the equivalents thereof.

(First Embodiment)

In a first embodiment, the invention is applied to a horizontal SBD 1 as a semiconductor device.

[Configuration of Horizontal SBD]

Referring to FIG. 1, the horizontal SBD 1 is constituted by the following components: a nitride group semiconductor functional layer 2; a first main electrode 3; a second main electrode 4; and metal oxide films 6. The nitride group semiconductor functional layer 2 includes a first nitride group semiconductor region 21, a second nitride group semiconductor region 22, and a two-dimensional carrier gas layer (a carrier passing region) 23. The two-dimensional carrier gas layer 23 is positioned on the first nitride group semiconductor region 21. The second nitride group semiconductor region 22 is present on the first nitride group semiconductor region 21, and functions as a barrier layer (a carrier producing region). The first main electrode 3 is electrically connected to one end of the two-dimensional carrier gas layer 23 while the second main electrode 4 is electrically connected to the other end of the two-dimensional carrier gas layer 23. The metal oxide films 6 are present between the first and second main electrodes 3 and 4, are positioned in the two-dimensional carrier gas layer 23 via a part of the nitride group semiconductor functional layer 2, and are electrically connected to the first main electrode 3. The two-dimensional carrier gas layer 23 has a low carrier density just under the metal oxide films 6 compared with a carrier density just under the first and second main electrodes 3 and 4. In this embodiment, the first main electrode 3 is an anode electrode while the second main electrode 4 is a cathode electrode. The two-dimensional carrier gas layer 23 is a two-dimensional electron gas layer. The electrical connection between the main electrodes and the two-dimensional carrier gas layer 23 is also assumed to cover a connection between these components accomplished by the tunnel effect.

The nitride group semiconductor functional layer 2 is directly made on a substrate such as a silicon substrate, a silicon carbide substrate, or a sapphire substrate (not shown) or is made indirectly via a buffer layer. Specifically, the nitride group semiconductor functional layer 2 is constituted by a III-group nitride semiconductor material, which is typically denoted by $Al_xIn_yGa_{1-x-y}N$ ($0 \leq x \leq 1$, $0 \leq y \leq 1$, or $0 \leq x+y \leq 1$). The first nitride group semiconductor region 21 is a GaN layer. The second nitride group semiconductor region 22 is an AlGaN layer which has lattices fewer than those of the first nitride group semiconductor 21, and has a large band gap. The second nitride group semiconductor region 22 is provided on the first nitride group semiconductor region 21 by the hetero junction.

In this embodiment, the first nitride group semiconductor region 21 is 0.5 μm to 10.0 μm thick, for instance, and is the GaN layer which is 2.5 μm to 3.5 μm thick, for instance. The second group semiconductor region is the AlGaN layer which is 5.0 nm to 100.0 nm thick, for instance. The two-dimensional carrier gas layer 23 is present near a hetero junction interface between the first and second nitride group semiconductor regions 21 and 22, is close to the first nitride group semiconductor region 21, and is produced in response to the spontaneous polarization and piezopolarization of the semiconductor regions 21 and 22. The two-dimensional carrier gas layer 23 functions as a channel region for high mobility carriers in the horizontal SBD 1.

The first main electrode (anode electrode) 3 is electrically connected to one end of the two-dimensional carrier gas layer 23, and is constituted by a material which functions as a Shottky barrier. Specifically, a 10 nm to 50 nm thick Ni layer and a 100 nm to 1000 nm thick Au layer are stacked for this purpose. The first main electrode 3 is preferably constituted by the material whose rising voltage is low compared with that of the metal oxide films 6 in order to reduce a rising voltage of the horizontal SBD 1 when a forward operation voltage is initially applied. The second main electrode (cathode electrode) 4 is constituted by a material which can be electrically connected to the other end of the two-dimensional carrier gas layer 23 by the ohmic contact. Specifically, a 10 nm to 50 nm thick Ti layer and a 100 nm to 1000 nm Al layers are stacked as the second main electrode 4, for instance.

The metal oxide films 6 are present between the first and second main electrodes 3 and 4, and are close to the first main electrode 3. During the reverse operation of the horizontal SBD 1, an electric field builds up at the first main electrode 3, via which a leakage current mainly flows. Actually, the two-dimensional carrier gas layer 23 is produced around the first main electrode 3, which functions as the leakage current path. In short, the two-dimensional carrier gas layer 23 is in a shape of a flat ring extending around the first main electrode 3. Alternatively, the metal oxide films 6 may be in a shape of flat dot pattern extending around the first main electrode 3 so that adjacent depletion layers can be linked around the first main electrode 3 during the reverse operation of the horizontal SBD 1.

The metal oxide films 6 control the carrier density (electron density) of the two-dimensional carrier gas layer 23 while the horizontal SBD 1 is in the reverse operation.

In order to reduce the reverse leakage current of the horizontal SBD 1, the metal oxide films 6 are preferably constituted by a material having a low reverse leakage current compared to the material of the first main electrode 3 (e.g. an insulating material). For instance, a p type oxide material is used as the metal oxide films 6. Specifically, oxidized nickel ($NiO_x$: where x is an optional number, and is 2, for instance) is usable. Further, the metal oxide films 6 may be constituted by ferric oxide ($FeO_x$: where x is an optional number, and is 2, for instance) or may be cobalt oxide ($CoO_x$: where x is an optional number, and is 1 for instance) or may be manganese oxide ($MnO_x$: where x is an optional number, and is 1 for instance). Still further, the metal oxide films 6 may be copper oxide ($CuO_x$: where x is an optional number, and is 1, for instance). Still further, the metal oxide films 6 may be a composite film containing two or more materials as well as NiO. In this embodiment, the metal oxide films 6 are an NiO film which is relatively thick, and 5 nm to 500 nm thick, preferably 5 nm to 400 nm thick, for instance.

The metal oxide films 4 are prepared by the lift-off process and the sputtering process. Specifically, a mask having an opening for the metal oxide films 6 are made on the nitride group semiconductor functional region 2 using the lift-off process. Then, the mask is placed in a sputtering unit, which is filled with a gas containing oxygen at room temperature (preferably a mixed argon and oxygen gas), so that the oxidized nickel is produced by the sputtering process. As the mask is removed, any unnecessary substances are also removed from the mask, so that the metal oxide films 6 may be obtained. The oxidized nickel is sputtered in a gas containing oxygen, which is effective in producing the metal oxide films 6 having a relatively high hole concentration.

The foregoing metal oxide films 6 have a relatively high resistivity. Therefore, a potential under the metal oxide films 6 can be relatively raised. It is possible to suppress the two-dimensional carrier gas layer 23 of the first nitride group semiconductor region 21 which is present just under the metal oxide films 6. This is effective in suppressing the reverse leakage current.

The metal oxide material can be easily patterned and fabricated. Further, so long as the easy patterning and fabrication are allowable, a p type GaN layer or a p type AlGaN layer is also usable.

In the horizontal SBD 1, the first main electrode 3 extends to the metal oxide films 6 via an insulating film 5 (a passivation film), and overlaps on a flat surface of the metal oxide films 6. The extension of the first main electrode 3 functions as a field plate.

[Operation of Horizontal SBD]

The forward operation is carried out in the horizontal SBD 1 (shown in FIG. 1) as follows. In response to the application of a high voltage to the first main electrode 3, a voltage which is lower than the voltage to the first main electrode 3 is applied to the second main electrode 4. When a potential difference between the first and second main electrodes 3 and 4 becomes larger than a rising voltage Vf, a forward current flows from the first main electrode 3 to the second main electrode 4 via the two-dimensional carrier gas layer 23. In this state, the carrier density is constant in the two-dimensional carrier gas layer 23, which is effective in reducing the rising voltage Vf and the differential on-state resistance.

The horizontal SBD 1 performs the reverse operation in the following manner. No voltage is applied to the first and second main electrodes 3 and 4, or a low voltage is applied to the first main electrode 3 while a voltage higher than the voltage to the first main electrode 3 is applied to the second main electrode 4. In this state, the potential same as that of the first main electrode 3 is also applied to the metal oxide films 6, which is effective in reducing the carrier density of the two-dimensional carrier gas layer 23 just under the metal oxide films 6 at the one end of the first main electrode 3. So long as the metal oxide films 6 are constituted by the material whose reverse leakage current is low compared to that of the first main electrode 3, the reverse leakage current can be more efficiently suppressed in the horizontal SBD 1. Therefore, the leakage current path can be narrowed or blocked, so that the reverse leakage current can be reduced.

[Features of First Embodiment]

Figure 2:
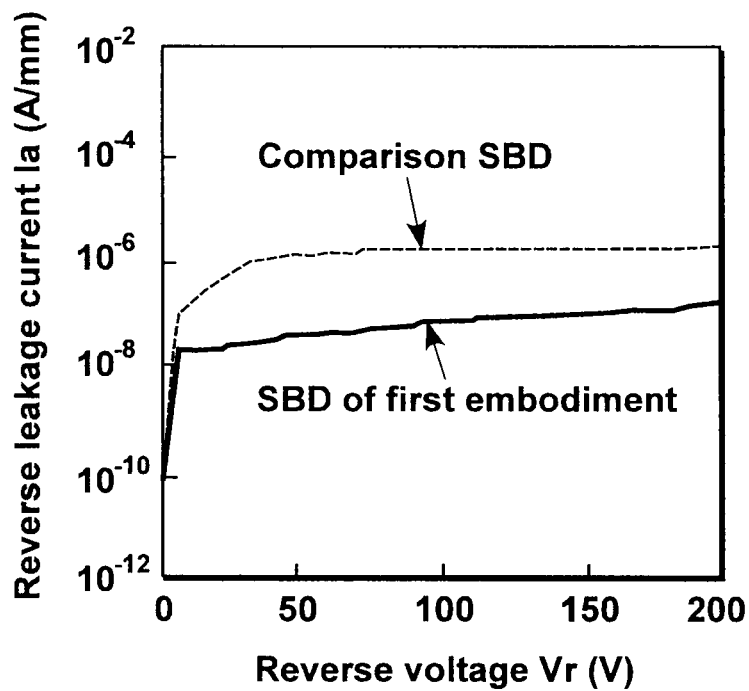
FIG. 2 is a graph showing reverse characteristics of the semiconductor device of FIG. 1.

Reverse characteristics of the horizontal SBD 1 are shown in FIG. 2, in which the abscissa denotes a reverse voltage Vr while the ordinate denotes a leakage current Ia. The reverse leakage current Ia of the horizontal SBD 1 of the invention can be reduced by single digit figure or more compared to the leakage current Ia of a comparison example which does not have metal oxide films 6.

The horizontal SBD 1 of the first embodiment can reduce the reverse leakage current while it relatively maintains the forward characteristics in the forward operation. This is because the horizontal SBD 1 is provided with the metal oxide films 6 between the first and second main electrode 3 and 4, and the carrier density of the two-dimensional carrier gas layer 23 immediately under the metal oxide films 6 can be reduced.

[First Modified Example]

Figure 3:
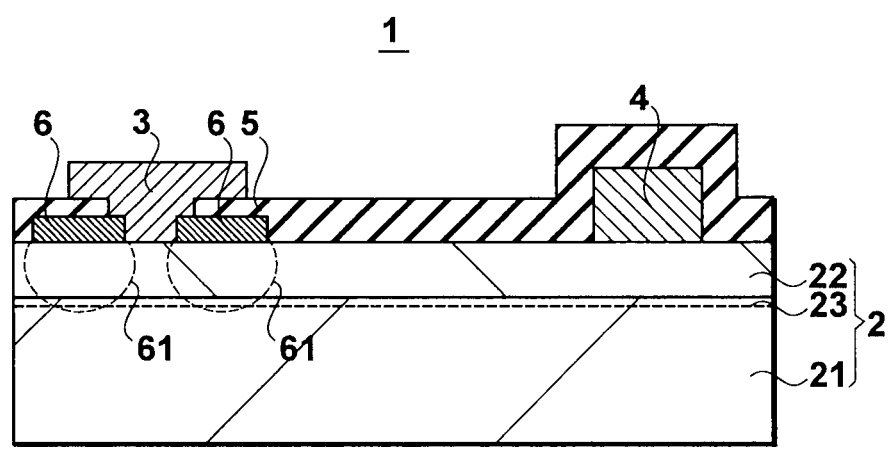
FIG. 3 is a cross sectional view of an essential part of a semiconductor device in a first modified example of the first embodiment.

Referring to FIG. 3, a horizontal SBD 1 of a first modified example produces depletion layers 61 from an interface of the metal oxide films 6 and the second nitride group semiconductor region 22 to the nitride group semiconductor functional layer 2. In other words, the depletion layers 61 extend to or preferably across the two-dimensional carrier gas layer 23. In the latter case, the two-dimensional carrier gas layer 23 is completely depleted at one end of the first main electrode 3 and just under the metal oxide films 6. Therefore, the first main electrode 3 may be an ohmic electrode similarly to the second main electrode 4. In such a case, the on-state voltage can be lowered.

In the first modified example, the horizontal SBD 1 can reduce the reverse leakage current while it relatively maintains the forward characteristics in the forward operation. This is because the horizontal SBD 1 includes the metal oxide films 6, and the depletion layers 61 produced from an interface between the metal oxide film 6 and the second nitride group semiconductor region 22 to the nitride group semiconductor functional layer 2. The depletion layers 61 are effective in reducing the carrier density of the two-dimensional carrier gas layer 23 and blocking the two-dimensional carrier gas layer 23. When the first main electrode 3 is the ohmic electrode similarly to the second main electrode 4, the on-state voltage can be lowered.

[Second Modified Example]

Figure 4:
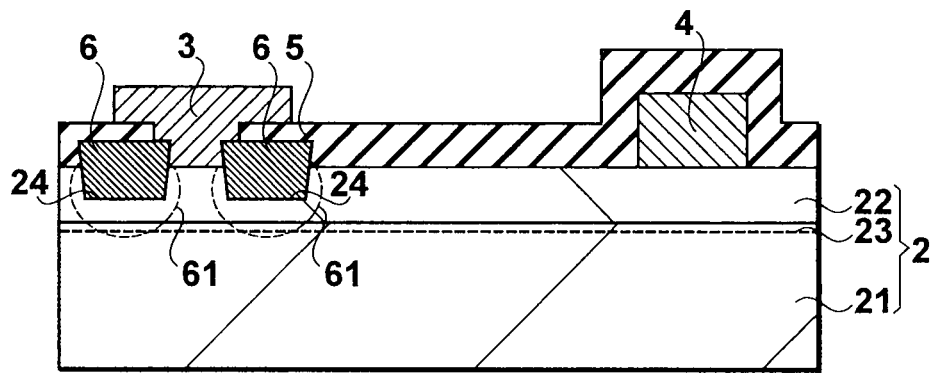
FIG. 4(a) is a cross sectional view of an essential part of a semiconductor device in a second modified example of the first embodiment.
FIG. 4(b) is a cross sectional view of an essential part of a semiconductor device in a third modified example of the first embodiment.
FIG. 4(c) is a cross sectional view of an essential part of a semiconductor device in a fourth modified example of the first embodiment.
Figure 4:
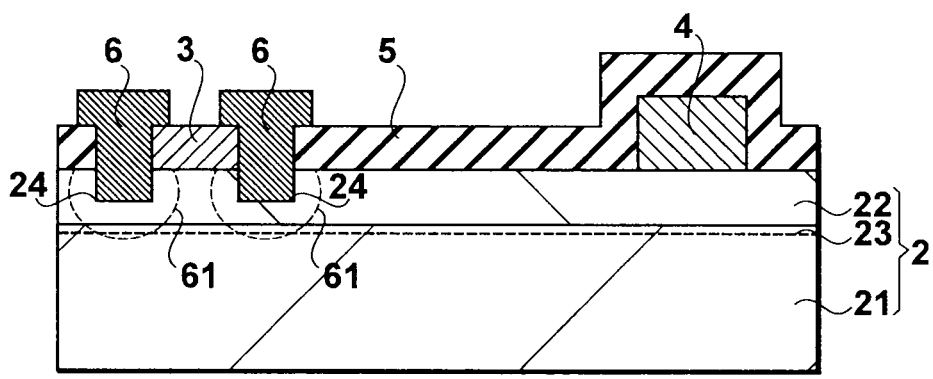
Figure 4:
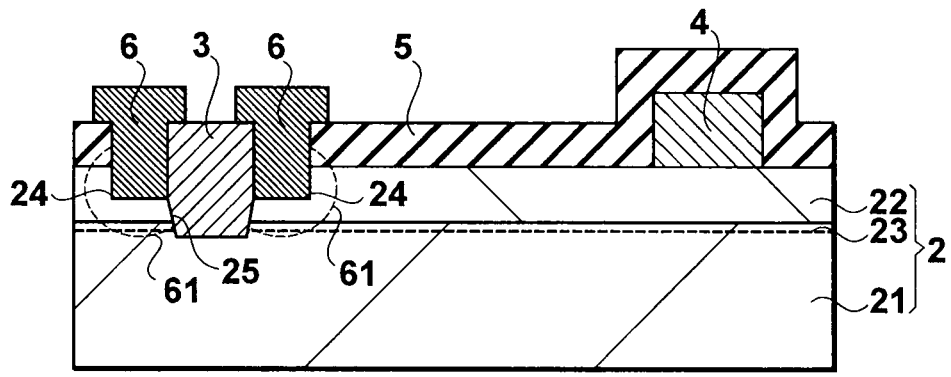

In a second modified example shown in FIG. 4(*a*), a horizontal SBD 1 has recesses 24 extending from the surface of the second nitride group semiconductor region 22 to the two-dimensional carrier gas layer 23, and metal oxide films 6 which extend from the second nitride group semiconductor region 22 and are positioned in the recesses 24 (on sides or bottoms thereof). The recesses 24 are made by scraping the surface of the secondary nitride group semiconductor region 22, and effectively shorten an effective distance between the metal oxide films 6 and the two-dimensional carrier gas layer 23. Since the metal oxide films 6 are buried in the recesses 24, the depletion layers 61 can easily cross the two-dimensional carrier gas layer 23 during the reverse operation. Further, the recesses 24 are made on the secondary nitride group semiconductor region 22 and do not to reach the upper surface of the first nitride group semiconductor region 21 where the two-dimensional carrier gas layer 23 is present. Therefore, the two-dimensional carrier gas layer 23 just under the recesses 24 does not disappear during the forward operation.

The horizontal SBD 1 of the second modified example can easily reduce the reverse leakage current while relatively maintaining the forward characteristics during the forward operation. This is because the depletion layers 61 extending between the metal oxide films 6 and the nitride group semiconductor functional layer 2 can easily lower the carrier density of the two-dimensional carrier gas layer 23 and block the two-dimensional carrier gas layer 23. Especially, when the first electrode 3 is ohmic similarly to the second main electrodes 4, the on-state voltage can be lowered.

[Third Modified Example]

As shown in FIG. 4(b), a horizontal SBD 1 of a third modified example has the first main electrode 3 which does not extend to the upper surface of the metal oxide films 6. In short, the metal oxide films 6 extend to the upper surface of the first main electrode 3. In the third modified example, the horizontal SBD 1 differs from the horizontal SBD 1 of the second modified example shown in FIG. 4(a).

In the horizontal SBD 1 of the third modified example, the metal oxide films 6 are present in the recesses 24, and the depletion layers 61 are present between the metal oxide films 6 and the nitride group semiconductor functional layer 2. During the reverse operation, the depletion layers 61 can easily reduce the carrier density of the two-dimensional carrier gas layer 23 just under the metal oxide film, and block the two-dimensional carrier gas layer 23. The horizontal SBD 1 can lower the reverse leakage current while relatively maintaining the forward characteristics during the forward operation. Especially, when the first and second main electrodes 3 and 4 are ohmic electrodes, the on-state voltage can be lowered.

It is assumed here that the metal oxide films 6 are used in a hot environment (e.g. when the ohmic electrodes are being annealed). In such a case, thresholds may become negative, and the metal oxide films 6 cannot be sufficiently depleted. Unfortunately, the rising voltage tends to become zero or negative. In the third modified example, the metal oxide films 6 are made after the first main electrode 3, and are not exposed to hot environments. Therefore, the horizontal SBD 1 will not suffer from the foregoing problems.

[Fourth Modified Example]

Referring to FIG. 4(c), a horizontal SBD 1 of a fourth modified example includes first recesses 24 and metal oxide films 6. The first recesses 24 extend from the surface of the nitride group semiconductor region 22 of the nitride group semiconductor functional layer 2 to the two-dimensional carrier gas layer 23. The metal oxide films 6 are partly made by scraping the surface of the second nitride group semiconductor region 22, and are placed in the first recesses 24. This is effective in shortening an effective distance between the metal oxide films 6 and the two-dimensional carrier gas layer 23. The metal oxide films 6 in the first recesses 24 are effective in making the depletion layers cross the two-dimensional carrier gas layer 23. The SBD 1 also includes second recesses 25, which extend from the surface of the second nitride group semiconductor region 22 to the two-dimensional carrier gas layer 23, and are deeper than the first recesses 24. Further, the first main electrode 3 is placed in the second recesses 25 in order to lower contact resistance with the two-dimensional carrier gas layer 23. The second recesses 25 preferably pass through the second nitride group semiconductor region 22 and reach the two-dimensional carrier gas layer 23.

According to the fourth modified example, the metal oxide films 6 are placed in the first recesses 24, the depletion layers 61 are produced between the metal oxide films 6 and the nitride group semiconductor function layer 2, and lower the carrier density of the two-dimensional carrier gas layer 23 just under the metal oxide films 6, and easily block the two-dimensional carrier gas layer 23. Therefore, the horizontal SBD 1 can reduce the reverse leakage current while relatively maintaining the forward characteristics during the forward operation.

(Second Embodiment)

If it is possible to completely deplete the two-dimensional carrier gas layer 23 just under the first main electrode 3 while no voltage is applied, as in the horizontal SBD 1 of the first and second modified examples of the first embodiment, a field effect transistor (FET) can function as a diode having a different operation mechanism. A second embodiment is intended to operate the FET as the diode.

[Configuration of Horizontal FET]

Figure 5:
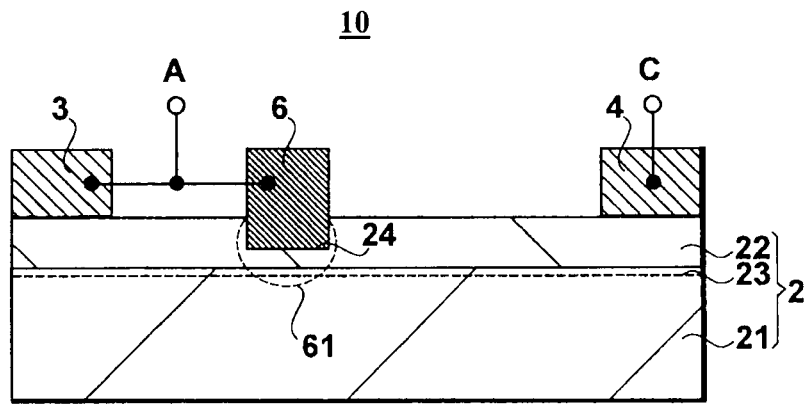
FIG. 5 is a cross sectional view of an essential part of a semiconductor device according to a second embodiment of the invention.

Referring to FIG. 5, a horizontal diode (semiconductor device) 10 includes a nitride group semiconductor functional layer 2, a first main electrode 3, a second main electrode 4, and a metal oxide film 6, similarly to the horizontal SBD 1 of the first embodiment. The nitride group semiconductor functional layer 2 is constituted by: a first nitride group semiconductor region 21; a two-dimensional carrier gas layer 23 placed on the first nitride group semiconductor region 21; a second nitride semiconductor region 22 placed on the first nitride group semiconductor region 21 and functions as a barrier. The first main electrode 3 is electrically connected to one end of the two-dimensional carrier gas layer 23. The second main electrode 4 is electrically connected to the other end of the two-dimensional carrier gas layer 23. The metal oxide film 6 is placed between the first and second main electrodes 3 and 4, and on the secondary carrier gal layer 23 via a part of the nitride group semiconductor functional layer 2, is electrically connected to the first main electrode 3, and depletes the two-dimensional carrier gas layer 23.

In this embodiment, the first main electrode 3 is an anode electrode, and is preferably constituted either by a material (e.g. a composite film of an Au layer and an Ni layer) functioning as a Shottky barrier as in the horizontal SBD 1 of the first embodiment, or by a material (e.g. a composite film of a Ti layer and an Al layer) for accomplishing the ohmic contact in order to reduce the on-state voltage during the forward operation of the horizontal diode 10. The second main electrode 4 is a cathode electrode, and is constituted by a material for accomplishing the ohmic contact similarly to the second main electrode 4 of the horizontal SBD 1 of the first embodiment.

The metal oxide film 6 is positioned in a recess 24 similarly to the metal oxide film 6 of the horizontal SBD 1 in the second modified example of the first embodiment, and is electrically connected to the first main electrode 3, but is spaced from the first main electrode 3. The metal oxide film 6 is constituted by a material for reducing the carrier density of the two-dimensional carrier gas layer 23.

In the second embodiment, since the metal oxide film 6 has a relatively high resistance, a rising voltage Vf of the horizontal diode 10 during the forward operation does not depend upon a contact state of the metal oxide film 6 and the second nitride group semiconductor region 22 but upon a depleted state of the two-dimensional carrier gas layer 23. Therefore, the metal oxide film 6 functions as a gate electrode of the FET (i.e. a high electron mobility transistor (HEMT) in this case). The rising voltage Vf is synonymous with a threshold voltage Vth of the HEMT.

[Operation and Features of Horizontal Diode]

The horizontal diode 10 performs the forward operation as described hereinafter. It is assumed that a source electrode of the HEMT carrying out a normally off-operation is the first main electrode 3, and that a gate electrode is the metal oxide 6. In this state, the horizontal diode 10 functions as a two-terminal diode. The threshold voltage Vth of the HEMT changes to the rising voltage Vf, which enables a forward current to flow.

Figure 6:
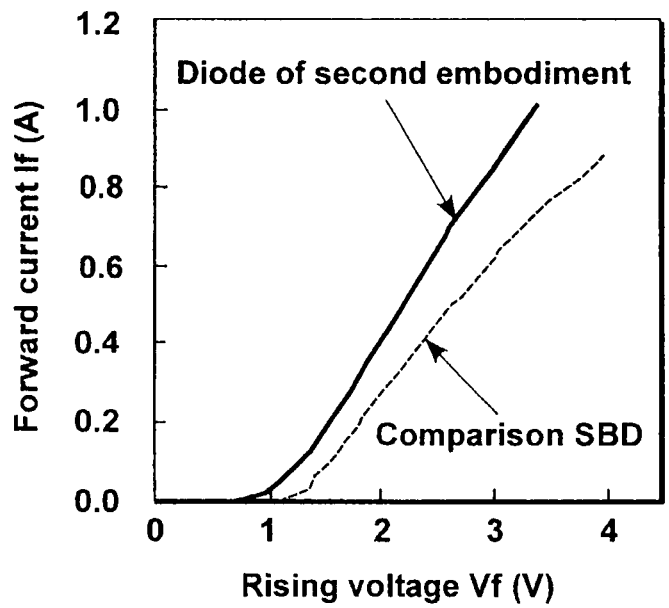
FIG. 6 is a graph showing forward characteristics of the semiconductor device of the second embodiment.

Forward characteristics of the horizontal diode 10 are shown in FIG. 6, where the abscissa denotes a rising voltage Vf while the ordinate denotes a rising current If. The horizontal diode 10 has the low rising voltage Vf and an increased rising current compared with a comparison example of an SBD.

Figure 7:
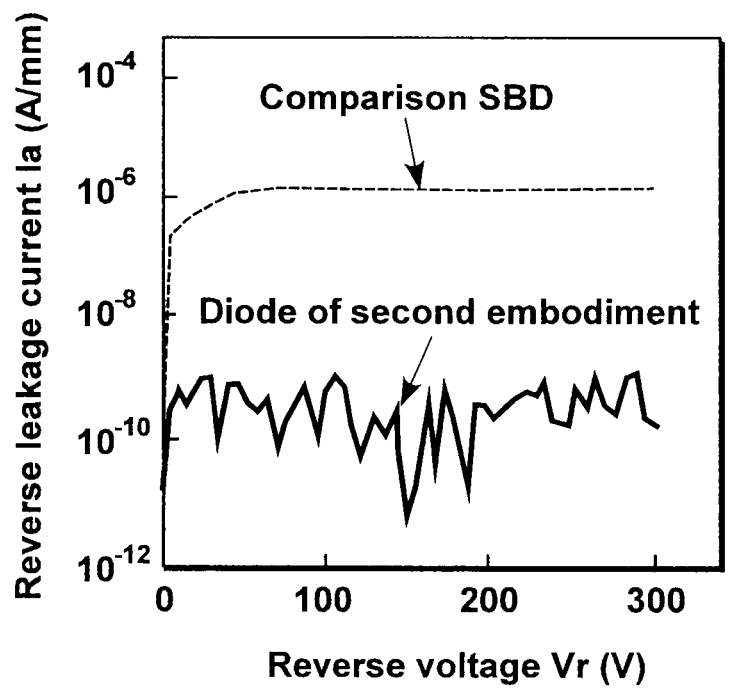
FIG. 7 is a graph showing reverse characteristics of the semiconductor device of FIG. 5.

During the reverse operation of the horizontal diode 10, a current similar to a gate leakage current of the HEMT flows from the second main electrode 4 (cathode electrode) to the first main electrode 3 (anode electrode) while the horizontal diode 10 functions as a diode. In FIG. 7, the ordinate denotes a leakage current Ia. Compared with the comparison SBD, the reverse leakage current Ia of the horizontal diode 10 is lowered by approximately three figures.

The horizontal diode 10 of the second embodiment includes the metal oxide film 6, and can completely deplete the two-dimensional carrier gas layer 23, which is effective in reducing the reverse leakage current and improving forward characteristics in the forward operation.

Further, the horizontal diode 10 may have a field plate similarly to the horizontal SBD 1 of the first embodiment.

(Other Embodiments)

While the invention herein disclosed has been described by means of specific embodiments and applications thereof, numerous modifications and variations could be made.

(1) P type characteristics (hole concentration) of the metal oxide films 6 are intensified when the metal oxide films 6 are thermally treated, are subject to the ozone ashing, or are subject to the $O_2$ (oxygen) ashing. Further, the reverse leakage current can be reduced while relatively maintaining the forward characteristics during the forward operation.

(2) The metal oxide films 6 may be constituted by a plurality of layers whose hole concentrations are gradually reduced from one main surface to the other main surfaces in contact with the nitride group semiconductor functional layer 2. In other words, the layer having the highest hole concentration is in contact with the nitride group semiconductor functional layer 2. The layers having different hole concentrations are made by sputtering nickel oxide (NiO) using a sputtering unit and by gradually reducing an amount of oxygen to be added. Since the layer having the highest hole concentration is in contact with the nitride group semiconductor functional layer 2, the horizontal diode 10 can reduce the reverse leakage current while relatively maintaining the forward characteristics in the forward operation.

Further, an amount of lithium (Li) to be doped may be changed as the metal oxide film 6 is being made, which is effective in changing the hole concentrations as the metal oxide film 6 is thickened.

What is claimed is:

1. A semiconductor device comprising:
a nitride group semiconductor functional layer including a second nitride group semiconductor region on a first nitride group semiconductor region where a two-dimensional carrier gas layer is made, the second nitride group semiconductor region functioning as a barrier layer;
a first main electrode electrically connected to one end of the two-dimensional carrier gas layer;
a second main electrode electrically connected to the other end of the two-dimensional carrier gas layer; and
a metal oxide film placed between the first and second main electrodes buried in a recess extending from a surface of the nitride group semiconductor functional layer to the two-dimensional carrier gas layer, and electrically connected to the first main electrode,
wherein the first main electrode extends over an upper surface of the metal oxide film, the metal oxide film is separated from the second main electrode to convey a substantially same voltage between the first main electrode and the metal oxide film during a reverse biasing.

2. The semiconductor device defined in claim 1, wherein the metal oxide film is constituted by at least one of nickel oxide, iron oxide, cobalt oxide, manganese oxide and copper oxide.

3. The semiconductor device defined in claim 1, wherein the metal oxide film surrounds the first main electrode intermittently or continuously.

4. The semiconductor device defined in claim 1, wherein the first main electrode extends to the upper surface of the metal oxide film via an insulating film.

5. The semiconductor device defined in claim 1, wherein the metal oxide film is placed on the two-dimensional carrier gas layer via a part of the nitride group semiconductor functional layer, and the metal oxide film reduces a carrier density of the two-dimensional carrier gas layer.

6. The semiconductor device defined in claim 5, wherein the metal oxide film is constituted by at least one of nickel oxide, iron oxide, cobalt oxide, manganese oxide and copper oxide.

7. The semiconductor device defined in claim 5, wherein the metal oxide film surrounds the first main electrode intermittently or continuously.

8. The semiconductor device defined in claim 5, wherein the first main electrode extends to the upper surface of the metal oxide film via an insulating film.

9. A semiconductor device comprising:
a nitride group semiconductor functional layer including a second nitride group semiconductor region on a first nitride group semiconductor region where a two-dimensional carrier gas layer is made, the second nitride group semiconductor region functioning as a barrier layer;
a first main electrode electrically connected to one end of the two-dimensional carrier gas layer;
a second main electrode electrically connected to the other end of the two-dimensional carrier gas layer; and
a metal oxide film placed between the first and second main electrodes so as to extend over an upper surface of the first main electrode, and electrically connected to the first main electrode, the metal oxide film is separated from the second main electrode to convey a substantially same voltage between the first main electrode and the metal oxide film during a reverse biasing.

10. The semiconductor device defined in claim 9, wherein the metal oxide film is constituted by at least one of nickel oxide, iron oxide, cobalt oxide, manganese oxide and copper oxide.

11. The semiconductor device defined in claim 9, wherein the metal oxide film surrounds the first main electrode intermittently or continuously.

12. The semiconductor device defined in claim 9, wherein the metal oxide film is buried in a recess extending from a surface of the nitride group semiconductor functional layer to the two-dimensional carrier gas layer.

* * * * *